(12) United States Patent
Xi

(10) Patent No.: US 7,729,190 B2
(45) Date of Patent: Jun. 1, 2010

(54) VOLTAGE CONTROL CIRCUIT, A VOLTAGE CONTROL METHOD AND A SEMICONDUCTOR MEMORY DEVICE HAVING THE VOLTAGE CONTROL CIRCUIT

(75) Inventor: Sung Soo Xi, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 185 days.

(21) Appl. No.: 11/776,607

(22) Filed: Jul. 12, 2007

(65) Prior Publication Data

US 2008/0144420 A1    Jun. 19, 2008

(30) Foreign Application Priority Data

Dec. 15, 2006    (KR) .................. 10-2006-0129031

(51) Int. Cl.
  *G11C 5/14* (2006.01)
(52) U.S. Cl. .................. 365/226; 365/203; 365/191; 365/189.09; 365/185.25
(58) Field of Classification Search ............ 365/185.02, 365/191, 185.25, 233.14, 233.15, 233.19, 365/226, 203, 202, 189.09
See application file for complete search history.

(56) References Cited

U.S. PATENT DOCUMENTS

| 6,049,495 | A  | * | 4/2000 | Hsu et al. ............... 365/203 |
| 6,449,204 | B1 | * | 9/2002 | Arimoto et al. ......... 365/222 |
| 6,870,790 | B2 | * | 3/2005 | Horiguchi et al. ...... 365/233.15 |
| 7,149,131 | B2 | * | 12/2006 | Choi et al. ............. 365/189.09 |

FOREIGN PATENT DOCUMENTS

KR    1020020002681    1/2002

\* cited by examiner

*Primary Examiner*—Pho M Luu
*Assistant Examiner*—Tha-O Bui
(74) *Attorney, Agent, or Firm*—Ladas & Parry LLP

(57) ABSTRACT

A semiconductor memory device includes a voltage control circuit providing different voltages as a precharge voltage in accordance with an active state and a standby stage. The semiconductor memory device is arranged in a peripheral region, whereby the different voltages can be provided as a precharge voltage in accordance with the active state and the standby state and thus leakage current is reduced and area efficiency is enhanced.

19 Claims, 4 Drawing Sheets

(PRIOR ART)

VOLTAGE CONTROL CIRCUIT, A VOLTAGE CONTROL METHOD AND A SEMICONDUCTOR MEMORY DEVICE HAVING THE VOLTAGE CONTROL CIRCUIT

CROSS-REFERENCE TO RELATED APPLICATIONS

The present application claims priority to Korean patent application number 10-2006-0129031 filed on Dec. 15, 2006, which is incorporated herein by reference in its entirety.

BACKGROUND OF THE INVENTION

The present invention relates to a semiconductor memory device, and more particularly to a voltage control circuit, a voltage control method and a semiconductor memory device having the voltage control circuit which can reduce leakage currents and improve precharge performance.

Generally, a semiconductor memory device enters into an active state in response to an active command and activates a given word line. Subsequently, the semiconductor memory device delivers cell data corresponding to the word line to outside through bit lines or stores the data delivered from outside on the corresponding cell through the bit lines.

When the semiconductor memory device enters a standby state in response to a precharge command, the bit line is precharged with bit line precharge voltage VBLP. Typically, the bit line precharge voltage has a half level of a core voltage VCORE, which is a cell data voltage.

Such semiconductor memory devices exhibit process defects such as a gate residue, which leads to producing a resistive short in the word line and in the bit line and in generating a current path. That is, when the semiconductor memory device is in the standby state, the standby current provided to the bit line can be leaked to a ground line via a subword line which is short-circuited.

Conventionally, a bleed voltage VBLEED lower than the bit line precharge voltage VBLP is applied to precharge the bit lines BL, BLB shown in FIG. 1, in order to reduce the leakage current generated by the gate residue.

More specifically, the leakage current to the ground line can be reduced by applying the bleed voltage VBLEED which is made lower than the bit line precharge voltage VBLP by a prescribed voltage level to the bit lines BL, BLB using a voltage control circuit 1, as shown in thick dotted lines in FIG. 1.

Herein, the voltage control circuit 1 is comprised of a bleeder resistor which enables constant currents to be flowed irrespective of loads in order to prevent the voltage from being changed due to variations of the load current.

The bleeder resistor can be comprised of a PMOS transistor or a NMOS transistor, wherein a gate is biased to a ground voltage VSS in a case of the PMOS transistor and a gate is biased to the power supply voltage VDD in a case of the NMOS transistor, in order to be maintained in a turn-on state.

On the other hands, the semiconductor memory device is divided into a core region and a peripheral region. The core region is divided into a memory cell array region 2, a subword line driver region 3, a sense amp array region 4 and a sense amp control region 5 which is a cross region of the subword line driver region 3 and the sense amp array region 4. The voltage control circuit 1 is arranged within the sense amp control region 5.

According to such prior art, since the voltage control circuit 1 is arranged in the core region, there is a problem in that the size of the other transistor controlling the core is reduced, which can result in decreasing the performance of the core.

Moreover, considering that, for example, a metal pitch is 1.2 μm, the number of a sense amp array is 33 per bank, and there are 4 banks with respect to a metal line 6 arranged to apply the bleed voltage VBLEED, a problem can occur when a length of the metal line 6 is increased by 80 μm and thus the total area of the semiconductor memory device is increased.

Further, since the voltage control circuit 1 can not control the bleed voltage VBLEED, it is difficult to satisfy an amount of leakage current required for certain specification, thereby reducing product yield of the semiconductor memory device. For example, if the amount of leakage current in the standby state can not satisfy specification defined in IDD2P, it is difficult to control the bleed voltage VBLEED, which results in poor yield of the semiconductor memory device.

Since the bleed voltage VBLEED lower than the precharge voltage VBLP is applied as the precharge voltage irrespective of the active state and the standby state, then the time to precharge the bit lines BL, BLB in the active state is increased, which necessarily results in lowering the precharge performance.

SUMMARY OF THE INVENTION

The present invention is contemplated to address some of the above problems by disclosing a voltage control circuit and a voltage control method which can provide a voltage which satisfies certain specifications as a bit line precharge voltage by searching certain voltages that minimize an amount of leakage current from a bit line to a word line.

The present invention also provides a semiconductor memory device that enhances area efficiency of other transistors which are used for controlling the core by arranging the voltage control circuit in a peripheral region, thereby improving performance of the core.

The present invention provides a semiconductor memory device with enhanced area efficiency that enables eliminating a metal line used for providing the bleed voltage by arranging the above-mentioned voltage control circuit.

A semiconductor memory device according to one embodiment of the present invention comprises: a voltage control unit which selects any one of the predetermined voltages to be provided as a bit line precharge voltage to correspond to each of the multiple modes in response to an active signal; and a control signal setting unit which receives the active signal and configured to set a level of a bleed control signal to hold the voltage, with certain specification voltage limits as the precharge voltage.

Preferably, the voltage control unit comprises a decoding unit configured to receive the active signal, the bleed control signal and a test mode signal to be decoded and outputs driving control signals generating the voltage to correspond to each mode and switch signals outputting the voltage to correspond to each mode; and a driving unit which is controlled by the driving control signals and the switching signals to select any one of the voltages to be outputted as the precharge voltage.

Preferably, the driving means comprises PMOS transistors which are connected to a first voltage line in series and controlled by each of the driving control signals to output the bleed voltages which are gradually made lower than the first voltage by a prescribed level; and NMOS transistors which are connected to the first voltage line in parallel and controlled by the switching signals to select any one of the first voltage and the bleed voltages to be outputted as the precharge voltage.

Preferably, the first voltage is a bit line precharge voltage.

Preferably, the control signal setting unit comprises a fuse unit means which outputs a fuse signal in accordance with whether the fuse is cut or not to correspond to each of the bleed control signals; and a control unit which outputs the bleed control signal activated when the active signal is activated and inverts the fuse signal to be outputted as the bleed control signal when the active signal is inactivated.

Preferably, the control unit comprises a NAND gate configured to combine the active signal and the fuse signal; and inverters configured to the bleed control signal output from the NAND gate.

Preferably, the fuse unit is configured to output the fuse signal held to cause the bleed control signal to have the same level to that of the test mode signal.

A voltage control method according to another embodiment of the present invention comprises: a first step of inputting signals setting multiple modes to a voltage control circuit; a second step of selecting any voltage of predetermined multiple voltages as a precharge voltage to be provided to a bit line in correspondence with each of the modes in the voltage control circuit; and a third step of holding the signals corresponding to any mode in which an amount of leakage current from the bit line to the word line satisfies certain specification, as a control signal.

The multiple modes comprise a first mode set with a first voltage; and a second mode and a third mode set with voltages which are gradually made lower than the first voltage by a prescribed level.

The first voltage is preferably a bit line precharge voltage.

Preferably, the first step activates an active signal to set the first mode, inactivates the active signal and activates a first test mode signal and a first bleed control signal to set the second mode, and inactivates the active signal and activates the second test mode signal and the second bleed control signal to set the third mode.

Preferably, the second step selects the first mode in which the first voltage is outputted as the precharge voltage according to a first switching signal if the active signal is activated; generates a first bleed voltage which is made lower than the first voltage by a prescribed level according to the first driving signal and selects the second mode according to a second switching signal, if the active signal is inactivated and the first test mode signal and the first bleed control signal are activated; and generates a second bleed voltage which is made lower than the first bleed voltage by a prescribed level according to the second driving signal and selects the third mode according to a third switching signal, if the active signal is inactivated and the second test mode signal and the bleed control signal are activated.

Preferably, the third step holds the bleed control signal selecting the mode if the prescribed mode is selected to provide corresponding voltage to the bit line and if an amount of the leakage current from the bit line to the word line satisfies certain specifications.

The bleed control signal is held by fuse cutting.

The semiconductor memory device according to another aspect of the present invention comprises a voltage control circuit which is activated in response to an active signal and is arranged in a peripheral region to provide different voltages as a precharge voltage in accordance with an active state and a standby state.

Preferably, the precharge voltage provided in the active state is a bit line precharge voltage.

Preferably, the precharge voltage provided in the standby state is at least lower than that provided in the active state.

Preferably, the precharge voltage is provided via a metal line applying the bit line precharge voltage.

DESCRIPTION OF SPECIFIC EMBODIMENTS

Hereinafter, preferred embodiments of the present invention will be described in detail with reference to the accompanying drawings.

The present invention provides a voltage control circuit, a voltage control method and a semiconductor memory device having the voltage control circuit that is configured to provide a voltage, within certain specification limits, as a bit line precharge voltage by searching the voltage which minimizes an amount of leakage current from a bit line to a word line.

Figure 1:
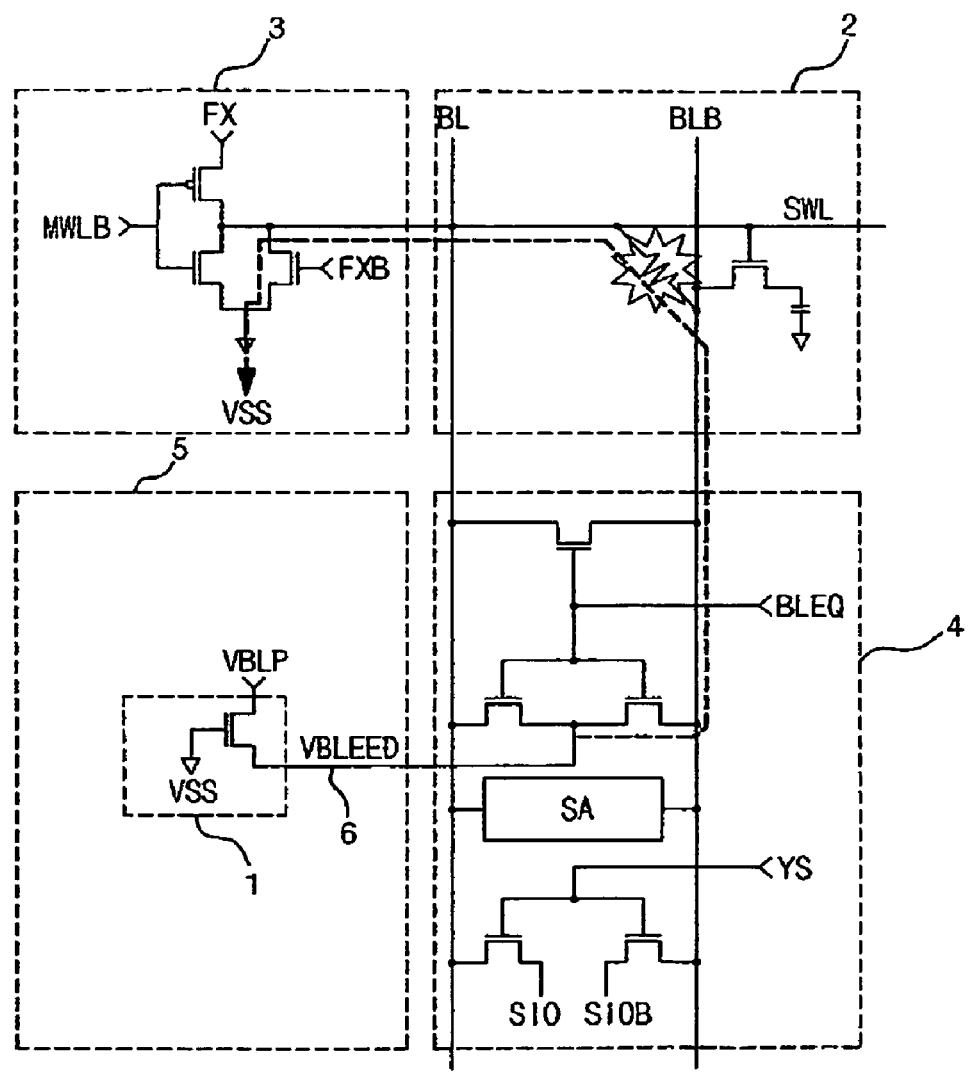
FIG. 1 depicts a circuit diagram illustrating a prior art semiconductor memory device to illustrate leakage currents which are generated due to short-circuit of a word line and a bit line.
Figure 2:
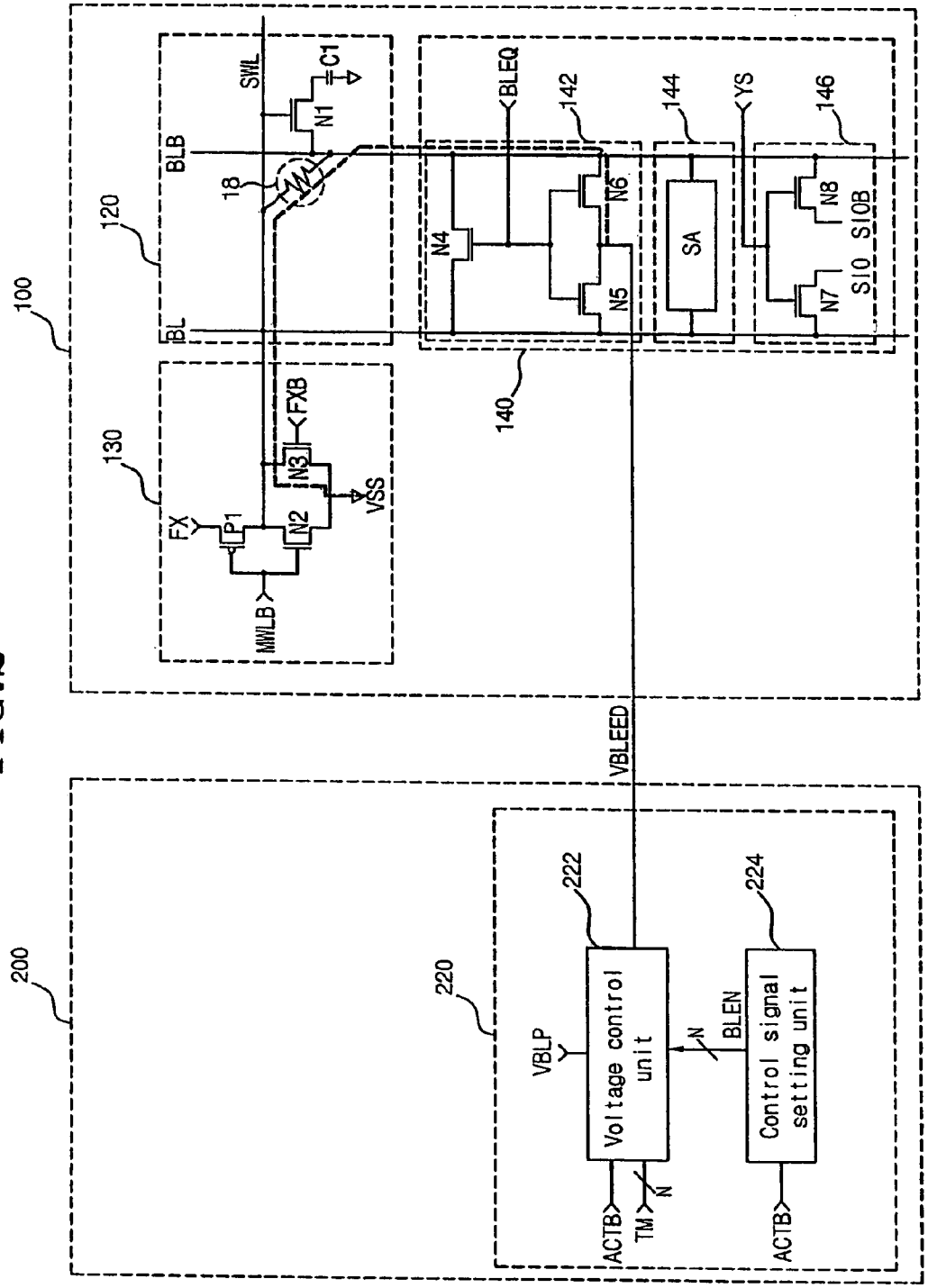
FIG. 2 depicts a circuit diagram illustrating a semiconductor memory device according to one embodiment of the present invention to reduce leakage currents generated due to short-circuit of the word line and the bit line.

Referring to FIG. 2, the semiconductor memory device according to an embodiment of the present invention has a bit line (BLB) and a subword line (SWL) short-circuited due to a gate residue so that a current path from the bit line (BLB) to the ground voltage VSS through a subword line (SWL) is formed as shown in thick dotted line of FIG. 2, whereby leakage currents are generated.

A core region 100 includes a memory cell array unit 120, a subword line driver unit 130, and a sense amp array unit 140, and a peripheral region 200 includes a voltage control circuit 220 providing a precharge voltage.

With respect to the core region 100, the memory cell array unit 120 includes memory cells which comprise a single NMOS transistor (N1) and a single capacitor (C1) respectively. The NMOS transistor (N1) is controlled by a signal provided from the subword line (SWL), of which one end is connected to the bit line (BLB) and other end is connected to the capacitor (C1).

The subword line driver unit 130 is consisted of a PMOS transistor (P1) and a NMOS transistor (N2) which determine whether the subword line SWL is activated according to the signal delivered to a main word line (MWLB) and a NMOS transistor (N3) which pulls down the subword line SWL to a level of the ground voltage (VSS) according to a signal (FXB) obtained by inverting the word line activating signal (FX). The subword line driver unit 130 delivers the word line activating signal (FX) generated by a signal obtained by decoding a row address to the corresponding subword line SWL if the main word line MWLB is activated.

The sense amp array unit 140 includes a precharge unit 142, a sense amp (SA) 144 and a column select unit 146.

The precharge unit 142 can be comprised of NMOS transistors (N4, N5, N6) which are connected between the bit line (BL) and the bit line (BLB) and are controlled by a bit line equalizing signal (BLEQ). The BLEQ is enabled when entering into a standby state in response to a precharge command to connect the bit line (BL) with the bit line (BLB) and equalize and precharge them. More specifically, the NMOS transistor N4 causes the bit lines (BL, BLB) to be the same voltage level, and the NMOS transistors N5, N6 have the bleed voltage (VBLEED) applied to a common node to precharge the bit lines (BL, BLB) with a prescribed voltage level. Herein, the prescribed voltage level is preferably in a level of the bit line precharge voltage VBLP.

The sense amp 144 can be comprised of inverters which are connected between the bit line (BL) and the bit line (BLB) in a latch form to sense and amplify a potential difference between the bit line (BL) and the bit line (BLB) in the active state.

The column select unit 146 can be comprised of NMOS transistors (N7, N8) which are connected between the bit lines (BL, BLB) and input/output lines (SIO, SIOB) respectively, to deliver data of corresponding bit lines (BL, BLB) to the input/output lines SIO, SIOB according to the column select signal (YS) or deliver data delivered from the input/output lines (SIO, SIOB) to corresponding bit lines (BL, BLB).

Although not shown in FIG. 2, there may be arranged separate circuits which controls connection between the memory cell array unit 120 and the bit line sense amp 144.

With respect to the peripheral region 200, the voltage control circuit 220 includes a voltage control unit 222 and a control signal setting unit 224.

Figure 3:
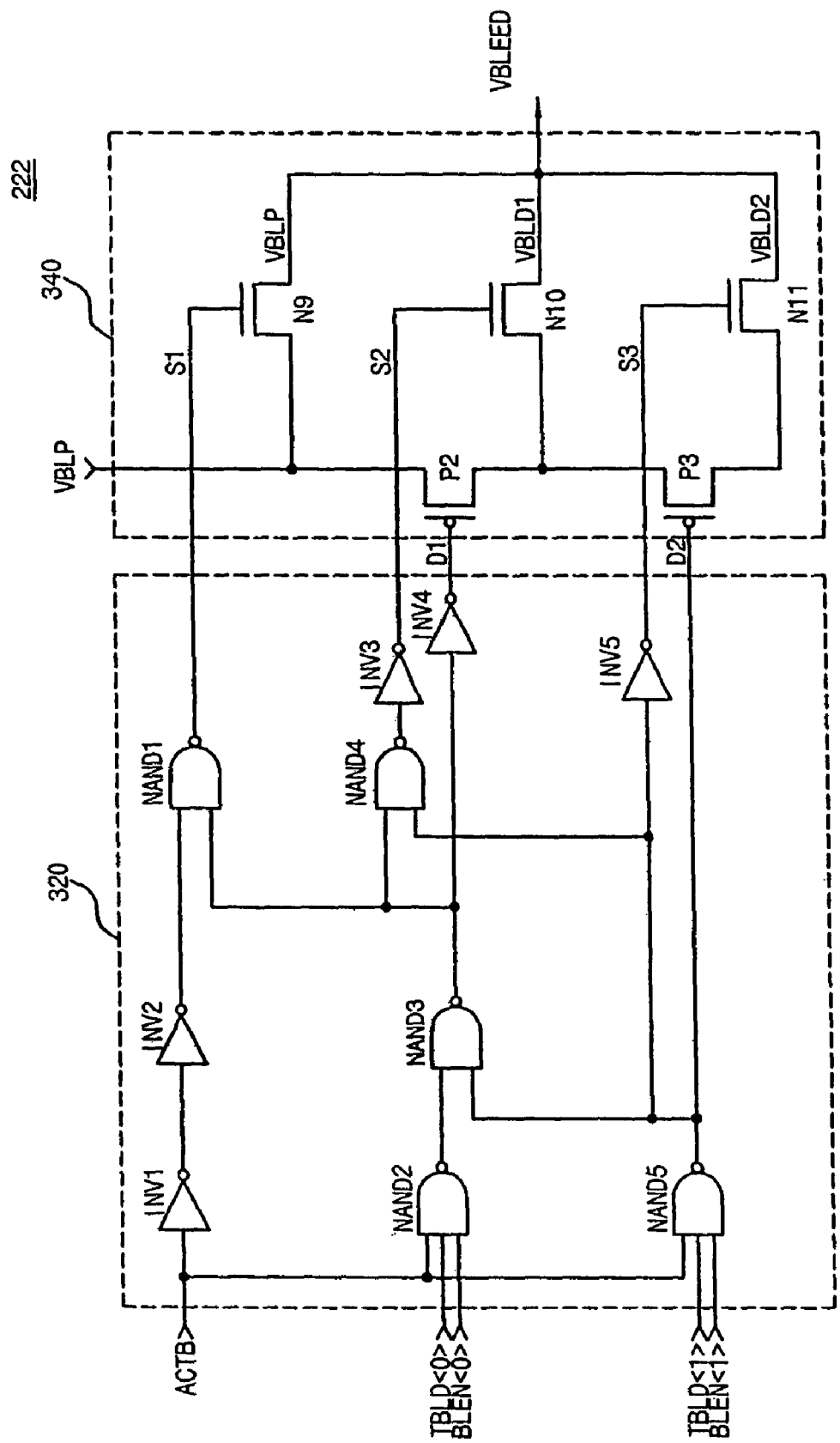
FIG. 3 depicts a circuit diagram of the voltage control unit in FIG. 2.

Referring to FIG. 3, the voltage control unit 222 includes a decoding unit 320 and a driving unit and controls the bleed voltage (VBLEED) to correspond to the amount of leakage current in the active state and the standby state.

The decoding unit 320 receives an inverted active signal (ACTB), a test mode signal (TBLD<0:1>) and a bleed control signal (BLEN<0:1>) and decodes the received signals to provide driving control signals (D1, D2) and switching signals (S1, S2, S3). The driving unit 340 is controlled by the driving control signals (D1, D2) and the switching signals (S2, S2, S3) in such a way that it outputs any one of the bit line precharge voltage VBLP and the bleed voltages (VBLD1, VBLD2) which are gradually made lower than the bit line precharge voltage VBLP as a precharge voltage (VBLEED), The decoding means 320 is consisted of a NAND gate (NAND5) to which the inverted active signal (ACTB), the test mode signal (TBLD<1>) and the bleed control signal (BLEN<1>) are inputted The NAND gate (NAND5) NAND-combine the inputted signals to be outputted as a driving control signal (D2). The inverter INV5 inverts the driving control signal (D2) to provide a switching signal (S3).

Also, the decoding unit 320 is comprised of a NAND gate (NAND2) to which the inverted active signal ACTB, the test mode signal (TBLD<0>) and the bleed control signal (BLEN<0>) are inputted. and The NAND gate (NAND2) NAND-combine these inputted signals. Outputs from the NAND gate (NAND2) and the NAND gate (NAND5) are inputted to a NAND gate (NAND3). The NAND gate (NAND3) is configured to NAND-combine these inputted signals to be outputted as a driving control signal (D1) via an inverter (INV4). Outputs from the NAND gate (NAND3) and the NAND gate (NAND5) are inputted to a NAND gate (NAND4). The NAND gate (NAND4) NAND-combine these inputted signals to be outputted as a switching signal (S2) via an inverter (INV3).

Further, a signal obtained by delaying the inverted signal ACTB via the inverters (INV1, INV2) and an output from the NAND gate (NAND3) are inputted to a NAND gate (NAND1). The NAND gate (NAND1) NAND-combine these inputted signals to be outputted as a switching signal (S1).

The driving unit 340 comprises PMOS transistors (P2, P3) which are connected to the bit line precharge voltage (VBLP) line in series. The PMOS transistor (P2) is configured to be controlled by the driving control signal (D1) to output the bleed voltage (VBLD1), which is made lower than the bit line precharge voltage (VBLP) by a prescribed level. The PMOS transistor (P3) is controlled by the driving control signal (D2) to output the bleed voltage (VBLD2) which is made lower than the bleed voltage VBLD1 by a prescribed level. Further, the driving unit 340 comprises NMOS transistors (N9, N10, N11) which are connected to the bit line precharge voltage (VBLP) line in parallel and of which outputs are connected in common. Each of the NMOS transistors (N9, N10 and N11) is configured to be selectively switched by the switching signals (S1, S2 and S3), so that any one of the bit line precharge voltage (VBLP) and the bleed voltages (VBLD1, VBLD2) is provided as the precharge voltage (VBLEED).

That is, a plurality of PMOS transistors connected to the bit line precharge voltage (VBLP) line in series is controlled by corresponding driving control signal to output the bleed voltage (VBLD1, VBLD2) which is gradually made lower than the bit line precharge voltage (VBLP). Further, a plurality of NMOS transistors connected to the bit line precharge voltage (VBLP) line in parallel is controlled by a corresponding switching signal to select any one of the bit line precharge voltage (VBLP) and the bleed voltages (VBLD1, VBLD2) to be outputted as the precharge voltage.

Figure 4:
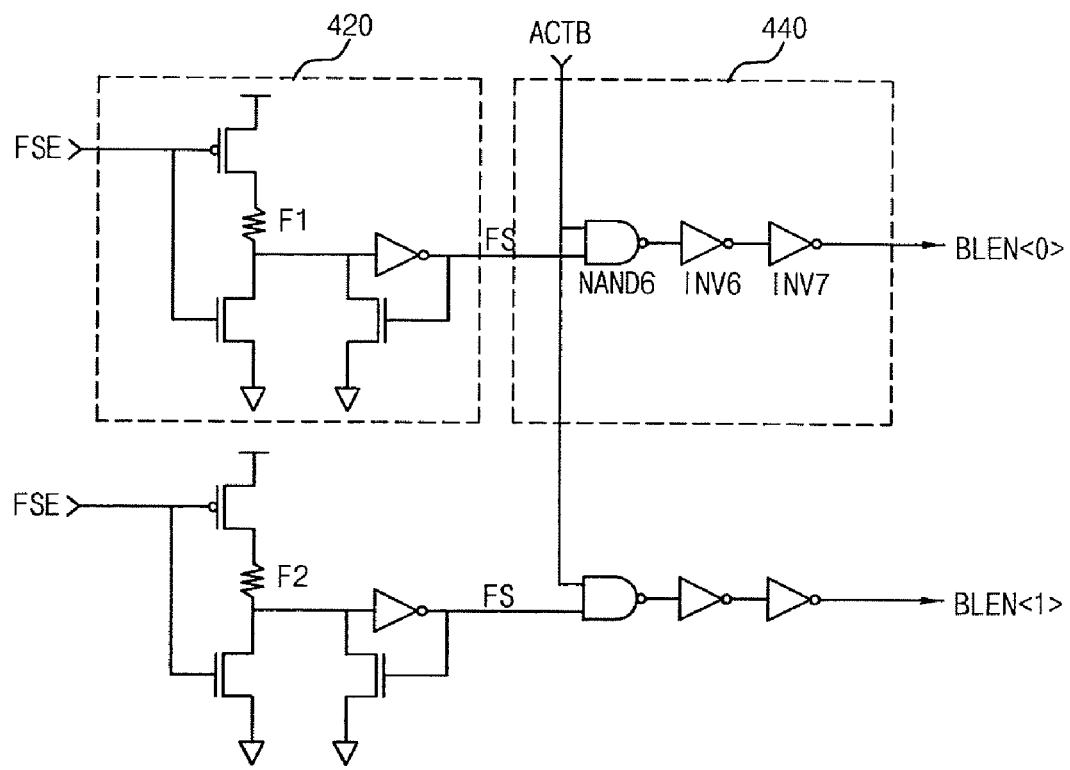
FIG. 4 depicts a circuit diagram of the control signal setting unit in FIG. 2.

Referring now to FIG. 4, the control signal setting unit 224 includes a fuse unit 420 and a control unit 440 corresponding to each bleed control signal (BLEN<0:1>).

Since the fuse unit 420 can comprise a general fuse circuit which is widely known in related art, additional explanations thereof will be omitted. The fuse unit 420 output a fuse signal (FS) of low level if the fuse (F1) is connected, and it output the fuse signal (FS) of high level if the fuse (F1) is short-circuited.

The control unit 440 includes a NAND gate (NAND6) which NAND-combines the inverted active signal (ACTB) and the fuse signal (FS). The inverters (INV6, INV7) which deliver an output from the NAND gate (NAND6) as the bleed control signal (BLEN<0>). The control unit 440 outputs the bleed control signal (BLEN<0>) of high level irrespective of the fuse signal (FS) by the inverted active signal (ACTB) disabled in the active state and outputs the bleed control signal (BLEN<0>) by inverting the fuse signal (FS) in the standby state. At this time, whether the fuse F1 is cut or not is determined to set the bleed control signal (BLEN<0>) level as a level of the corresponding test mode signal (TBLE<0>).

More specifically, the control signal setting unit 224 outputs the bleed control signal (BLEN<0>) of high level in the active state and the bleed control signal BLEN<0> of a fixed level in accordance with whether the fuse is cut or not in the standby state respectively.

With regard to voltage control method providing the bit line precharge voltage referring to FIG. 3 and FIG. 4, the method includes a first step of inputting signals setting multiple modes to a voltage control circuit; a second step of selecting any voltage of predetermined multiple voltages as a precharge voltage to be provided to a bit line in correspondence with each of the modes in the voltage control circuit; and a third step of holding the signals corresponding to any mode in which an amount of leakage current from the bit line to the word line satisfies certain specification, as a control signal.

More specifically, in the first step, the plurality of modes can be divided into first through third modes, in which the first mode is to provide voltage of highest level, and the second mode and the third mode are to provide voltage lower than in the first mode in order. Herein, the voltage of highest level in the first mode is preferably the bit line precharge voltage (VBLP).

It will be appreciated that although embodiment of three modes is exemplified, the present invention can be implemented in simpler or more modes according to intention of a manufacturer.

The inverted active activating signal (ACTB) of low level is provided to the voltage control circuit as a signal used for setting the first mode, the inverted active activating signal (ACTB) and the test mode signal (TBLD<0>) and the bleed control signal (BLEN<0>) of all high level are provided to the voltage control circuit as a signal used for setting the second mode, and the inverted active signal (ACTB) and the test mode signal (TBLD<1>) and the bleed control signal (BLEN<1>) of all high level are provided to the voltage control circuit as a signal used for setting the third mode.

The second step can allow certain voltage to be provided to the bit line as the precharge voltage (VBLEED) by selecting the mode according to signals inputted to correspond to various modes.

In other words, if the inverted active activating signal (ACTB) of low level is provided to the voltage control circuit, the switching signal (S1) becomes high level to turn on the NMOS transistor (N9), thereby selecting the first mode in which the bit line precharge voltage (VBLP) is outputted as the precharge voltage (VBLEED).

Meanwhile, if the inverted active activating signal (ACTB) and the test mode signal (TBLD<0>) of all high level are provided to the voltage control circuit, the driving control signal D1 becomes low level to turn on the PMOS transistor (P2), and thus the bleed voltage (VBLD1) is made lower than the bit line precharge voltage (VBLP) by a prescribed level and the switching signal (S2) becomes high level to turn on the NMOS transistor (N10), thereby selecting the second mode in which the bleed voltage (VBLD1) is outputted as the precharge voltage (VBLEED).

Further, if the inverted active activating signal (ACTB), the test mode signal (TBLD<1>) and the bleed control signal (BLEN<1>) of all high level are provided to the voltage control circuit, the driving control signals (D1, D2) become low level to turn on the PMOS transistors (P2, P3) and thus the bleed voltage (VBLD2) is made lower than the bleed voltage (VBLD1) by a prescribed level and the switching signal (S3) becomes high level to turn on the NMOS transistor (N11), thereby selecting the third mode in which the bleed voltage (VBLD2) is outputted as precharge voltage (VBLEED).

That is, since the inverted active activating signal (ACTB) becomes low level when in the active state, the first mode is selected to provide the bit line precharge voltage (VBLP) as the precharge voltage (VBLEED). Meanwhile, since the inverted active activating signal (ACTB) becomes high level when in the standby state and the bleed control signal (BLEN<0:1>) of high level is selectively provided as a default, the second mode or the third mode is selected to provide any one of the bleed voltages (VBLD1, VBLD2) as the precharge voltage (VBLEED) by providing the test mode signal (TBLD<0:1>) of high level selectively.

The third step can discriminate occurrence of the leakage current from the bit line to the word line if the certain voltage is provided to the bit line as the precharge voltage (VBLEED) as a result of the second step, and repeat the first step and the second step until the certain specification is satisfied by changing the selected mode if a value of the voltage is out of the certain specification. As a result, if it is determined that the signal satisfying the certain specification is inputted, the corresponding input signal is held as control signal used for providing the voltage to the bit line.

In other words, if the certain specification is satisfied as the bleed voltage (VBLD1) is applied, the bleed control signal (BLEN<1>) is held in low level by cutting the fuse corresponding to the bleed control signal (BLEN<1>) except of the bleed control signal (BLEN<0>). Meanwhile, if the certain specification is satisfied as the bleed voltage (VBLD2) is applied, the bleed control signal (BLEN<0>) is held in low level by cutting the fuse corresponding to the bleed control signal (BLEN<0>) except of the bleed control signal (BLEN<1>). And the test mode signal (TBLD<0:1>) used for the test is preferably held in high level.

With respect to operations of the semiconductor memory device, when entering into the active state, the bit line equalizing signal (BLEQ) is disabled so that the bit lines (BL, BLB) are separated with each other, and the word line activating signal (FX) is enabled so that the data is stored on corresponding memory cell via the bit lines (BL, BLB) or the data in the corresponding memory cell is delivered to the input/output lines (SIO, SIOB) via the bit lines (BL, BLB).

Then, if the precharge command is applied, the bit line equalizing signal (BLEQ) is enabled so that NMOS transistors (N4, N5, N6) are turn on and the bit lines (Bl, BLB) are connected with each other, and the subword line (SWL) is disabled and thus the inverted word line activating signal (FXB) is enabled so that the NMOS transistor (N3) is turned on.

At this time, since the bit line precharge voltage (VBLP) is applied to the precharge unit 142, the bit lines (BL, BLB) can have enough precharge voltage level rapidly, which results in improving precharge efficiency.

Subsequently, when entering into the standby state, the bleed voltage (VBLEED) is applied to the precharge unit 142 in order to minimize the leakage current in current path from the bit line to the ground voltage (VSS) via the subword line.

That is, the bit lines (BL, BLB) are allowed to reach the precharge voltage level rapidly by applying the bit line precharge voltage (VBLP) as the precharge voltage in the active state, and the leakage current is reduced to satisfy the certain specification by applying the bleed voltage (VBLEED) of level lower than that of the bit line precharge voltage (VBLP) to reduce the leakage current in the standby state, thereby decreasing defects and improving total yield.

As mentioned above, since the bleed voltage (VBLEED) can be applied via the metal line which applies the bit line precharge voltage (VBLP) by arranging the voltage control circuit in the peripheral region, additional metal line is not required and thus area efficiency of the semiconductor memory device is enhanced. Further, it is possible to prevent performance degradation followed by size reduction in other core transistors, which is caused by the voltage control circuit arranged in prior sense amp control region.

According to the present invention, it is possible to minimize or at least reduce an amount of leakage current from the bit line to the word line by providing the voltage control circuit which controls the bleed voltage in correspondence with the amount of the leakage current in the active state and the standby state.

Further, the present invention can enhance area efficiency of other transistor used for controlling the core by arranging the voltage control circuit in the peripheral region, thereby providing the semiconductor memory device with improved performance of the core.

Further, since the metal line used for providing the bleed voltage can be eliminated by arranging the voltage control circuit, it is possible to provide the semiconductor memory device that exhibits enhanced area efficiency.

Further, since precharge characteristic can be enhanced by arranging the voltage control circuit, it is possible to provide the semiconductor memory device with improved stability of operation and reduced leakage current.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor memory device, comprising:
   a voltage control unit selecting, in response to an active signal and a bleed control signal, any one of predetermined voltages to be provided as a bit line precharge voltage to correspond to each of multiple modes of the device; and
   a control signal setting unit receiving the active signal and setting a level of the bleed control signal to hold the selected voltage provided as the bit line precharge voltage within specified limits,
   wherein the bleed control signal is generated in the form of digital code.

2. The semiconductor memory device as set forth in claim 1, wherein the voltage control unit comprises:
   a decoding unit receiving the active signal, the bleed control signal and a test mode signal to be decoded, and the decoding unit outputting driving control signals generating the predetermined voltages that correspond to each mode of the device, and the decoding unit switching signals that control outputting of the predetermined voltage that correspond to the each mode; and
   a driving unit, controlled by the driving control signals, switching signals to select any one of the predetermined voltages to be outputted as the bit line precharge voltage.

3. The semiconductor memory device as set forth in claim 2, wherein the driving unit comprises:
   PMOS transistors connected to a first voltage line in series and controlled by each of the driving control signals, to output bleed voltages wherein bleed voltages are gradually made lower than a first voltage set at a prescribed level; and
   NMOS transistors connected to the first voltage line in parallel and controlled by the switching signals to select any one first voltage and any one bleed voltages to be outputted as the bit line precharge voltage.

4. The semiconductor memory device as set forth in claim 3, wherein the first voltage is the bit line precharge voltage.

5. The semiconductor memory device as set forth in claim 1, wherein the control signal setting unit comprises:
   a fuse unit, in response to each of the bleed control signals, outputting a fuse signal corresponding to whether the fuse is cut or not; and
   a control unit, activated when the active signal is in an activated state, outputting the bleed control signal and the control unit inverting the fuse signal to be outputted as the bleed control signal when the active signal is in an inactivated state.

6. The semiconductor memory device as set forth in claim 5, wherein the control unit comprises:
   a NAND gate combining together the active signal and the fuse signal; and
   inverters outputting output from the NAND gate as the bleed control signal.

7. A semiconductor memory device as set forth in claim 5, wherein the fuse unit outputs the fuse signal to cause the bleed control signal to be at approximately the same potential as the test mode signal.

8. The voltage control method comprising the steps of:
   inputting one of a plurality of active signals, wherein the active signals are used to set corresponding multiple modes of a voltage control circuit;
   selecting a predetermined multiple voltage as a precharge voltage to be provided to a bit line corresponding to each mode of the voltage control circuit; and
   holding the inputted active signal corresponding to one of the modes when an amount of leakage current from the bit line to the word line is within certain specified limits.

9. The voltage control method as set forth in claim 8, wherein the inputting step activates the active signal to set the first mode, inactivates the active signal and activates a first test mode signal and a first bleed control signal to set a second mode, and inactivates the active signal and activates a second test mode signal and a second bleed control signal to set a third mode.

10. The voltage control method as set forth in claim 8, wherein the multiple modes comprises:
    a first mode set with the active signal having a first voltage; and
    a second mode set with the active signal having a second voltage; and
    a third mode set with the active signal having a third voltage, wherein the first voltage is greater than the second voltage, wherein the second voltage is greater than the third voltage, whereby the first, second and third voltages are gradually made lower than the first voltage by a prescribed level.

11. The voltage control method as set forth in claim 10, wherein the first voltage is the bit line precharge voltage.

12. The voltage control method as set forth in claim 10, wherein the inputting step activates the active signal to set the first mode, inactivates the active signal and activates a first test mode signal and a first bleed control signal to set the second mode, and inactivates the active signal and activates the second test mode signal and the second bleed control signal to set the third mode.

13. The voltage control method as set forth in claim 9, wherein the second step comprises:
    selecting the first mode in which the active signal having the first voltage is outputted as the precharge voltage according to a first switching signal if the active signal is activated;
    generating a first bleed voltage having a lower voltage than the first voltage by a prescribed level in response to a first driving signal and selecting the second mode in response to a second switching signal, if the active signal is inactivated and the first test mode signal and the first bleed control signal are activated; and
    generating a second bleed voltage which is made lower than the first bleed voltage by a prescribed lever in response to a second driving signal and selecting the third mode in response to a third switching signal, if the active signal is inactivated and the second test mode signal and the bleed control signal are activated.

14. The voltage control method as set forth in claim 9, wherein the holding step holds the bleed control signal selecting the mode if a prescribed mode is selected to provide corresponding voltage to the bit line and an amount of a leakage current from the bit line to the word line is within certain specified limits.

15. The voltage control method as set forth in claim 14, wherein the bleed control signal is held by fuse cutting.

16. A semiconductor memory device, comprising a voltage control circuit which is activated in response to an active signal and is arranged in a peripheral region to provide different voltages as a precharge voltage in accordance with an active state and a standby state, wherein the precharge voltage is held by a bleed control signal, and the bleed control signal is generated in the form of digital code.

17. The semiconductor memory device set forth in claim 16, wherein the precharge voltage provided in the active state is a bit line precharge voltage.

18. The semiconductor memory device set forth in claim 16, wherein the precharge voltage provided in the standby state is at least lower than that provided in the active state.

19. The semiconductor memory device set forth in claim 16, wherein the precharge voltage is provided via a metal line applying the bit line precharge voltage.

* * * * *